US010553420B2

(12) United States Patent
Yamashita

(10) Patent No.: US 10,553,420 B2
(45) Date of Patent: Feb. 4, 2020

(54) METHOD AND DEVICE FOR POLISHING SEMICONDUCTOR WAFER

(71) Applicant: SUMCO TECHXIV CORPORATION, Nagasaki (JP)

(72) Inventor: Kenji Yamashita, Tokyo (JP)

(73) Assignee: SUMCO TECHXIV CORPORATION, Nagasaki (JP)

(*) Notice: Subject to any disclaimer, the term of this patent is extended or adjusted under 35 U.S.C. 154(b) by 0 days.

(21) Appl. No.: 14/912,426

(22) PCT Filed: May 29, 2014

(86) PCT No.: PCT/JP2014/064252
§ 371 (c)(1),
(2) Date: Feb. 17, 2016

(87) PCT Pub. No.: WO2015/029524
PCT Pub. Date: Mar. 5, 2015

(65) Prior Publication Data
US 2016/0196966 A1 Jul. 7, 2016

(30) Foreign Application Priority Data
Aug. 28, 2013 (JP) ................. 2013-176825

(51) Int. Cl.
H01L 21/02 (2006.01)
B24B 37/005 (2012.01)
(Continued)

(52) U.S. Cl.
CPC ...... H01L 21/02024 (2013.01); B24B 37/005 (2013.01); B24B 37/345 (2013.01);
(Continued)

(58) Field of Classification Search
CPC ........ H01L 21/02052; H01L 21/67057; H01L 21/02024
See application file for complete search history.

(56) References Cited

U.S. PATENT DOCUMENTS

2003/0036570 A1* 2/2003 Abe .................. H01L 21/02052
516/113
2003/0190810 A1* 10/2003 Cooper ............. H01L 21/02024
438/692
(Continued)

FOREIGN PATENT DOCUMENTS

CN 102554788 7/2012
JP 11-285969 10/1999
(Continued)

OTHER PUBLICATIONS

Office Action issued in Taiwan Counterpart Patent Appl. No. 103117454, dated Jan. 7, 2016, along with an english translation thereof.
(Continued)

Primary Examiner — Bradley Smith
(74) Attorney, Agent, or Firm — Greenblum & Bernstein, P.L.C.

(57) ABSTRACT

A method includes: polishing a semiconductor wafer by a polishing device; measuring a form of the semiconductor wafer by a measuring device before a polished surface of the semiconductor wafer becomes hydrophilic; and setting polishing conditions for the polishing based on a measurement result of the form of the semiconductor wafer by a polishing condition setting unit.

4 Claims, 2 Drawing Sheets

(51) Int. Cl.
*B24B 37/34* (2012.01)
*H01L 21/67* (2006.01)
*H01L 21/66* (2006.01)

(52) U.S. Cl.
CPC .. *H01L 21/02052* (2013.01); *H01L 21/67057* (2013.01); *H01L 21/67253* (2013.01); *H01L 22/20* (2013.01)

(56) References Cited

U.S. PATENT DOCUMENTS

| | | | |
|---|---|---|---|
| 2004/0074526 A1* | 4/2004 | Aoki | B08B 3/02 |
| | | | 134/36 |
| 2005/0205835 A1* | 9/2005 | Tamboli | C11D 3/2086 |
| | | | 252/79.1 |
| 2010/0120333 A1* | 5/2010 | Sin | B24B 37/013 |
| | | | 451/5 |
| 2012/0231703 A1 | 9/2012 | Torii et al. | |

FOREIGN PATENT DOCUMENTS

| | | |
|---|---|---|
| JP | 2000-254860 | 9/2000 |
| JP | 2003-249477 | 9/2003 |
| JP | 2012-508454 | 4/2012 |
| TW | 526301 | 4/2003 |
| WO | 01/71788 | 9/2001 |
| WO | 2009/008594 | 11/2009 |

OTHER PUBLICATIONS

International Preliminary Report on Patentability for PCT/JP2014/064252, dated Mar. 1, 2016.

Office Action issued in China Counterpart Patent Appl. No. 201480047485.8, dated Apr. 20, 2017, along with an English translation thereof.

\* cited by examiner

METHOD AND DEVICE FOR POLISHING SEMICONDUCTOR WAFER

TECHNICAL FIELD

The present invention relates to a semiconductor wafer polishing method and a semiconductor wafer polishing apparatus.

BACKGROUND ART

Semiconductor wafers are usually polished through a plurality of processing steps. Specifically, the processing steps mainly include rough polishing for providing a high flatness to semiconductor wafers and finish polishing for reducing surface roughness. Techniques have been suggested to polish semiconductor wafers with a high accuracy (see, for instance, Patent Literature 1).

A double-side polishing apparatus used for a method according to Patent Literature 1 includes a light emitter that emits a parallel beam and a light receiver that receives the parallel beam, the light emitter and the light receiver being provided on an internal gear in a manner facing each other.

In such a double-side polishing apparatus, when a carrier and a semiconductor wafer held in a carrier hole of the carrier enter a beam transmittable area between the light emitter and the light receiver, the carrier and the semiconductor wafer, which are exposed on upper and lower platens, are irradiated with the parallel beam. The shade of the semiconductor wafer irradiated with the parallel beam is detected by the beam receiver, and a thickness of the shade is directly measured as a thickness of the semiconductor wafer. When the beam receiver detects that the thickness of the shade reaches a target value, the rotation of each of the upper and lower platens is stopped.

CITATION LIST

Patent Literature(s)

Patent Literature 1: JP-A-11-285969

SUMMARY OF THE INVENTION

Problems to be Solved by the Invention

The technique according to Patent Literature 1 requires measurement during polishing, so that measurement accuracy is lowered by disturbance due to, for instance, the vibration of a polishing apparatus, the expansion of a fixed portion of the beam emitter and/or the beam receiver due to a change in ambient temperature, and/or drops of a slurry remaining on the semiconductor wafer.

To solve such a problem, the polished semiconductor wafer taken out of the polishing apparatus may be measured by a form measuring device so that the measurement result is fed back to the next and future polishing steps.

Such a technique using the form measuring device, however, requires cleaning a measurement surface of the semiconductor wafer by washing and drying it. The cleaned and dried surface is measured by the form measuring device.

However, any waterdrop remaining on the semiconductor wafer causes, for instance, disturbance of the measurement, and thus lowers the measurement accuracy. Accordingly, an additional processing step is necessary to check whether or not any waterdrop remains. Further, remaining waterdrop(s) needs to be removed by another additional processing step. Such processing steps delay the feedback after the completion of polishing.

An object of the invention is to provide a semiconductor wafer polishing method and a semiconductor wafer polishing apparatus capable of polishing a semiconductor wafer with a high accuracy.

Means for Solving the Problem(s)

According to an aspect of the invention, a semiconductor wafer polishing method includes: polishing a semiconductor wafer; measuring a form of the semiconductor wafer before a polished surface of the semiconductor wafer becomes hydrophilic; and setting polishing conditions for the polishing based on a measurement result of the form of the semiconductor wafer.

When polished, the semiconductor wafer has a hydrophobic polished surface, which becomes hydrophilic after being left in air or water for a predetermined time.

The form of the polished semiconductor wafer cannot be measured in the measuring step due to waterdrops remaining on the hydrophilic polished surface of the semiconductor wafer.

Accordingly, the form of the semiconductor wafer is measured before the polished surface of the semiconductor wafer becomes hydrophilic, i.e., when the polished surface is hydrophobic, in the above aspect. The form of the polished semiconductor wafer can thus be highly accurately measured without any measurement error. Further, based on the measurement result, polishing conditions for the next polishing step are set. The measurement result of the polished semiconductor wafer can thus be quickly fed back to the polishing conditions for the next polishing step, thereby manufacturing highly accurate and flat semiconductor wafers.

In the above aspect, it is preferable that the semiconductor wafer polishing method further includes: immersing the semiconductor wafer in an organic acid solution after the semiconductor wafer is polished but before the semiconductor wafer is measured; and pulling up the semiconductor wafer from the organic acid solution before an immersion time of the immersing exceeds 60 minutes.

In the above aspect, prior to the measuring step, the polished semiconductor wafer is immersed in the organic acid solution. The surface of the polished semiconductor wafer can be kept hydrophobic by immersing the semiconductor wafer in the organic acid solution. Further, for instance, a polishing slurry remaining on the surface of the polished semiconductor wafer having been rinsed with pure water can be neutralized.

The concentration of the organic acid solution used for the immersion is preferably in a range from 0.001 mass % to 10 mass %, more preferably in a range from 0.01 mass % to 1.0 mass %, particularly preferably 0.1 mass %. When the concentration of the organic acid solution is less than 0.001 mass %, the semiconductor wafer cannot have a clean hydrophobic surface, on which waterdrops may remain. In contrast, when the concentration of the organic acid solution is more than 10 mass %, a particulate foreign substance contained in the solution may stick to the surface of the semiconductor wafer.

The semiconductor wafer is pulled up from the organic acid solution before the immersion time in the immersing step exceeds 60 minutes. When the immersion time exceeds 60 minutes, the polished surface becomes hydrophilic. In this case, the semiconductor wafer is pulled up from the organic acid solution with waterdrops remaining on the polished surface thereof. Since the semiconductor wafer cannot be measured due to the remaining waterdrops, an additional processing step for removing the waterdrops is required.

In contrast, when the semiconductor wafer is pulled up from the organic acid solution before the immersion time exceeds 60 minutes, the polished surface is still hydrophobic, and thus no waterdrop remains on the polished surface.

In the above aspect, it is preferable that the semiconductor wafer is pulled up at a speed of 100 mm/sec or less.

In the above aspect, the semiconductor wafer can be pulled up at a speed of 100 mm/sec or less without any rise of the solution from the level of the solution. Thus, no waterdrop remains on the polished surface of the semiconductor wafer pulled up from the organic acid solution. When the speed exceeds 100 mm/sec, the semiconductor wafer may be pulled up from the organic acid solution with a rise of the solution (i.e., waterdrops) from the level of the solution. Specifically, the semiconductor wafer is preferably pulled up at a speed in a range from 10 mm/sec to 100 mm/sec, particularly preferably in a range from 30 mm/sec to 60 mm/sec.

In the above aspect, it is preferable that the semiconductor wafer is pulled up while kept in a posture with the polished surface of the semiconductor wafer being substantially orthogonal to a horizontal surface.

In the above aspect, when the semiconductor wafer is pulled up in a posture with the polished surfaces thereof being substantially orthogonal to the horizontal surface, waterdrops are likely to gravitationally fall off. The waterdrops can thus be quickly removed from the polished surface. Consequently, the process quickly advances to the measuring step.

Here, "a posture with the polished surfaces thereof being substantially orthogonal to the horizontal surface" includes not only a posture with the polished surface being precisely orthogonal to the horizontal surface, but also a posture with the polished surface being substantially orthogonal to the horizontal surface with a slight inclination as long as no waterdrop remains on the surface of the semiconductor wafer pulled up from the solution. For instance, the semiconductor wafer may be pulled up in a posture with the polished surface thereof being substantially orthogonal to the horizontal surface with an inclination of approximately five degrees.

In the above aspect, it is preferable that the form of the semiconductor wafer is measured by an optical sensor or an electro-capacitance sensor.

In the above aspect, the use of the optical sensor or the electro-capacitance sensor for the measurement leads to reducing measurement time and downsizing the measuring device. Feedback can thus be further quickly provided to the polishing conditions for the next polishing step.

In the above aspect, it is preferable that an organic acid in the organic acid solution is at least one of a citric acid, a formic acid, an acetic acid, a butyric acid, an oxalic acid, a malonic acid and a succinic acid.

In the above aspect, the surface of the polished semiconductor wafer can be kept hydrophobic by immersing the semiconductor wafer in the solution containing at least one of these various organic acids.

According to another aspect of the invention, a semiconductor wafer polishing apparatus includes: a polishing device configured to polish a semiconductor wafer; a storage bath configured to store the semiconductor wafer and contain an organic acid solution; a measuring device configured to measure a form of the semiconductor wafer; a transport device configured to transport the semiconductor wafer between the polishing device, the storage bath and the measuring device; and a polishing condition setting unit configured to set polishing conditions used by the polishing device based on a measurement result from the measuring device.

The apparatus of the above aspect allows the polished semiconductor wafer to be transported between the polishing device, the storage bath and the measuring device by the transport device, significantly reducing a transport time of the semiconductor wafer among these devices as compared with a typical apparatus.

Further, the measurement result obtained by the measuring device, i.e., the measurement result of the form of the polished semiconductor wafer, is sent to the polishing condition setting unit. Based on the measurement result, the polishing condition setting unit analyzes the polishing conditions to give feedback to the polishing conditions for the next polishing step. The measurement result of the polished semiconductor wafer can thus be quickly fed back to the polishing conditions for the next polishing step, thereby manufacturing highly accurate and flat semiconductor wafers.

In the above aspect, it is preferable that an organic acid in the organic acid solution is at least one of a citric acid, a formic acid, an acetic acid, a butyric acid, an oxalic acid, a malonic acid and a succinic acid.

In the above aspect, the surface of the polished semiconductor wafer can be kept hydrophobic by immersing the semiconductor wafer in the solution containing at least one of these various organic acids.

DESCRIPTION OF EMBODIMENT(S)

First Exemplary Embodiment

A first exemplary embodiment of the invention will be first described below with reference to the attached drawings.

Figure 1:
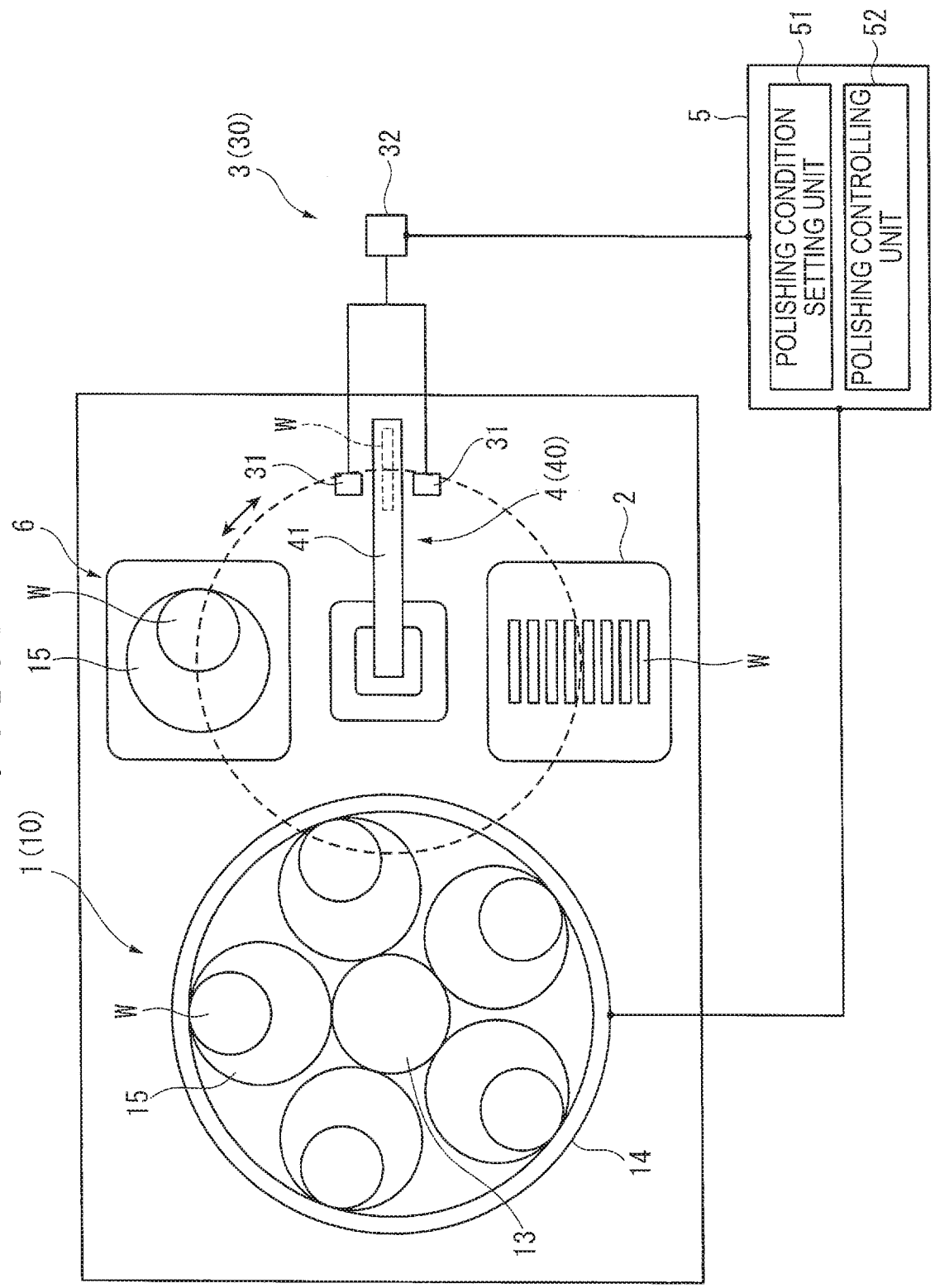
FIG. 1 schematically shows an arrangement of a semiconductor wafer polishing apparatus according to the invention.

FIG. 1 schematically shows an arrangement of a semiconductor wafer polishing apparatus according to the invention.

As shown in FIG. 1, the semiconductor wafer polishing apparatus according to the invention includes a polishing device 1, a storage bath 2, a measuring device 3, a transport device 4, and a polishing condition setting unit 51. The semiconductor wafer polishing apparatus according to the invention also includes a storing unit 6 for storing a plurality of unpolished semiconductor wafers W and carriers 15. It should be noted that FIG. 1 shows that a single semiconductor wafer W is held in each of the carriers 15 for simplification of illustration, but a plurality of semiconductor wafers can, of course, be held in each of the carriers 15.

Figure 2:
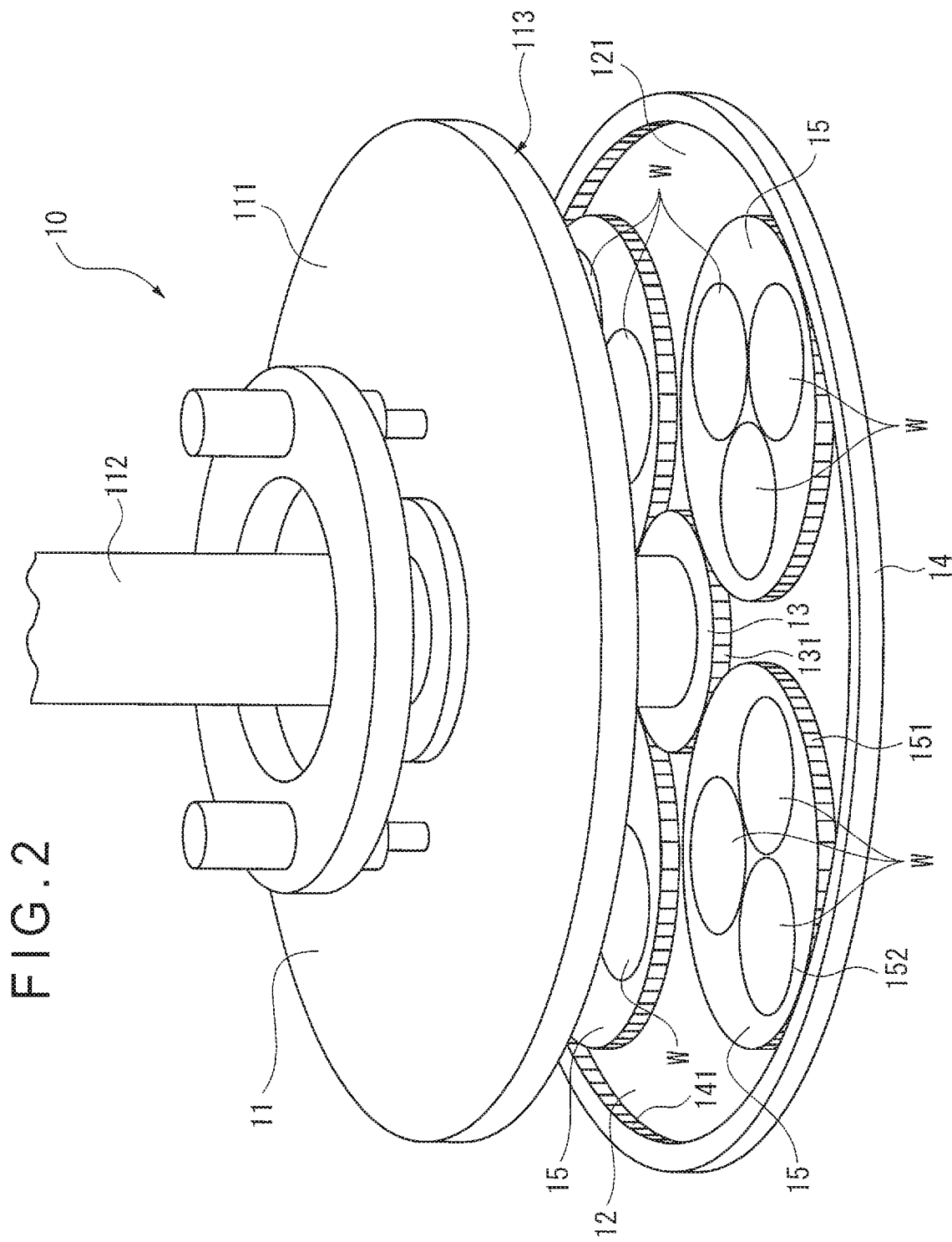
FIG. 2 schematically shows an arrangement of a double-side polishing apparatus according to an exemplary embodiment of the invention.

The polishing device 1 is exemplified by a double-side polishing machine 10 shown in FIG. 2 in the first exemplary embodiment.

Arrangement of Double-Side Polishing Apparatus

Description will be made on the double-side polishing machine 10 used in a polishing step according to the first exemplary embodiment.

FIG. 2 schematically shows an arrangement of the double-side polishing apparatus according to the first exemplary embodiment.

As shown in FIG. 2, the double-side polishing machine 10 includes an upper platen 11, a lower platen 12, an inner gear 13, an outer gear 14, and the plurality of carriers 15. A plurality of semiconductor wafers W are held in each of the carriers 15. It should be noted that FIG. 2 shows that three of the semiconductor wafers W are held in each of the carriers 15.

The upper platen 11 includes a platen body 111 and an elevation mechanism 112 for moving the platen body 111 toward or away from the lower platen 12.

The platen body 111 is substantially in the form of a disc, and includes a polishing pad 113 (not shown in FIG. 2). The polishing pad 113 is provided to a lower surface of the platen body 111, and is brought into contact with the semiconductor wafers W to polish the semiconductor wafers W. A plurality of supply holes are formed through an upper surface of the platen body 111 to supply a polishing slurry and pure water for rinsing between the upper platen 11 and the lower platen 12 during polishing.

The elevation mechanism 112, which includes a shaft provided substantially at the center of the platen body 111, is driven by a motor provided on a portal frame (not shown) disposed above to vertically move the platen body 111.

The lower platen 12, which is a disc-shaped body rotatably provided on a mount of the double-side polishing machine 10, has a surface that is opposite to the upper platen 11 and is provided with a polishing pad 121. In polishing, the lower polishing pad 121 is brought into contact with the surfaces of the semiconductor wafers W.

The inner gear 13 is provided substantially at the center of the disc-shaped lower platen 12, and is rotatable independently of the lower platen 12. An outer circumferential surface of the inner gear 13 is provided with gear teeth 131 meshed with the carriers 15.

The outer gear 14 is a ring body surrounding the lower platen 12, an inner circumferential surface of which is provided with gear teeth 141 meshed with the carriers 15.

The upper platen 11, the lower platen 12, the inner gear 13 and the outer gear 14 are linked to rotation shafts of separate driving motors at their rotation centers to be rotatable independently of one another by the driving motors.

Each of the carriers 15, which is in the form of a disc body, has an outer circumferential surface provided with gear teeth 151 meshed with the inner gear 13 and the outer gear 14. An in-plane area of the disc body is provided with a plurality of wafer holding holes 152, in which the semiconductor wafers W are stored.

Arrangement of Storage Bath

Referring back to FIG. 1, the storage bath 2, which is a water bath configured to store a plurality of semiconductor wafers W and contain an organic acid solution, may be a typical wet box. When stored in the storage bath 2, the semiconductor wafers W are preferably arranged at predetermined intervals not to contact with one another while kept in a posture with polished surfaces thereof being substantially orthogonal to a horizontal surface or level of the organic acid solution. The storage bath 2 may contain the organic acid solution in an amount sufficient for the semiconductor wafers W stored in the storage bath 2 to be fully immersed in the organic acid solution. The temperature of the organic acid solution may fall within a range from 0 degrees to 60 degrees, preferably within a range from 10 degrees to 40 degrees, particularly preferably within a range from 20 degrees to 30 degrees.

Arrangement of Measuring Device

The measuring device 3 is provided to measure forms of the semiconductor wafers W. Specifically, the measuring device 3 is intended to measure, forms of at least one of the semiconductor wafers W before and after polishing or polishing allowance forms of at least one of the semiconductor wafers W before and after polishing. In the first exemplary embodiment, measurement of the form of the semiconductor wafer W after polishing will be described.

The measuring device 3 is exemplified by a spectral interference displacement device 30 in the first exemplary embodiment. The spectral interference displacement device 30 includes sensors 31 each measuring the form of the semiconductor wafer W, and a controller unit 32. The sensors 31 are each optically connected to the controller unit 32.

The sensors 31, which are disposed at positions where they can measure front and back surfaces of the semiconductor wafer W (an object to be measured), include opposite front-side and rear-side sensors for measuring the front and rear surfaces of the semiconductor wafer W, respectively. The sensors 31 are each disposed orthogonally to the polished surface (the front or back surface) of the semiconductor wafer W at a distance from the polished surface.

The sensors 31 each emit light with a wide wavelength range to a measurement point defined in the polished surface of the semiconductor wafer W, and receive reflection light from the measurement point. The controller unit 32 analyzes the reflection light received by each of the sensors 31, and calculates a distance between each of the sensors 31 and the measurement point.

Arrangement of Transport Device

The transport device 4 is provided to transport the semiconductor wafers W between the polishing device 1, the storage bath 2 and the measuring device 3. The transport device 4 is exemplified by a transport unit 40 in the first exemplary embodiment.

The transport unit 40, which is a six-axis articulated robot, has an end provided with a wafer holder 41 for holding each of the semiconductor wafers W.

In the first exemplary embodiment, the double-side polishing machine 10, the storage bath 2 and the spectral interference displacement device 30 are arranged in the vicinity of the transport unit 40 as show in FIG. 1 so that the semiconductor wafer W held by the wafer holder 41 can be transported to the double-side polishing machine 10, the storage bath 2 or the spectral interference displacement device 30 by a horizontal rotation of the wafer holder 41.

Arrangement of Polishing Condition Setting Unit

A controller 5 includes, for instance, a combination of a CPU and a memory. The controller 5 also includes the polishing condition setting unit 51 and a polishing controlling unit 52.

The polishing condition setting unit 51 sets polishing conditions for the next polishing step. The polishing controlling unit 52 controls an operation of the double-side polishing machine 10 in accordance with predetermined polishing conditions. The controller 5 is electrically connected to the double-side polishing machine 10 and the controller unit 32 of the measuring device 3. The controller 5, for instance, acquires polishing conditions outputted from the double-side polishing machine 10, and outputs the polishing conditions set by the polishing condition setting unit 51. The controller 5 also acquires a measurement result of the semiconductor wafer W outputted from the controller unit 32. Based on the acquired measurement result of the semiconductor wafer W, the polishing condition setting unit 51 analyzes the polishing conditions for the polishing step.

Next, a semiconductor wafer polishing method according to the invention will be described.

Polishing Step

First, the unpolished semiconductor wafers W stored in the storing unit 6 are transported to the double-side polishing machine 10 by the transport device 4. In FIG. 1, the unpolished semiconductor wafers W in the storing unit 6 are transported onto the lower platen 12 of the double-side polishing machine 10 (the polishing device 1) along with the carriers 15. In response to an operation command from the polishing controlling unit 52, a polishing slurry is supplied between the upper and lower platens 11, 12, and the transported semiconductor wafers W are polished under the predetermined polishing conditions. After polishing, pure water is supplied between the upper and lower platens 11, 12 to rinse the polished semiconductor wafers W.

Immersing Step

After being polished under the predetermined polishing conditions, the semiconductor wafers W are taken out of the double-side polishing machine 10 and transported to the storage bath 2 by the transport device 4. The transported semiconductor wafers W are arranged at the predetermined intervals not to contact with one another while kept in the posture substantially orthogonal to the level of the organic acid solution, and fully immersed in the organic acid solution.

Pulling-Up Step

Before an immersion time in the immersing step exceeds 60 minutes, at least one of the semiconductor wafers W is pulled up from the organic acid solution by the transport device 4. The semiconductor wafer W is pulled up at a speed of 100 mm/sec or less by the transport device 4 while kept in the posture with the polished surfaces thereof being substantially orthogonal to the level of the solution.

Measuring Step

In the measuring step, at least one of the polished semiconductor wafers W is measured before the polished surfaces thereof become hydrophilic, i.e., when the polished surfaces are hydrophobic.

The semiconductor wafer W pulled up from the organic acid solution in the storage bath 2 in the pulling-up step before the immersion time in the immersing step exceeds 60 minutes is transported to the measuring device 3 by the transport device 4. The invention requires the sensors 31 to measure not the entire surface of the semiconductor wafer W but only desired points on the semiconductor wafer W. For instance, the semiconductor wafer W is radially measured from the center toward an outer periphery thereof at a pitch of 10 μm. It should be noted that the semiconductor wafer W is moved between the sensors 31, 31 by the transport device 4 to measure such a plurality of points by the sensors 31.

The measurement data acquired by the sensors 31 is processed by the controller unit 32 to calculate a difference between a thickness at a center of the wafer and a thickness at a point 1-mm or 2-mm inside from an outer peripheral edge of the wafer. A form of the entire surface of the wafer is determined based on this calculation result.

The measurement data acquired by the sensors 31 is also processed by the controller unit 32 to calculate a deviation of the thickness at the point 1-mm or 2-mm inside from the outer peripheral edge of the wafer from an approximate line of all the thicknesses measured within a range up to a point 30-mm inside. A form of the outer periphery of the wafer is determined based on this calculation result.

The calculation results from the controller unit 32 are outputted to the controller 5.

After subjected to the form measurement performed by the measuring device 3, the semiconductor wafer W is returned to the storage bath 2 by the transport device 4.

Polishing Condition Setting Step

The controller 5 acquires the polishing conditions outputted from the double-side polishing machine 10 and the resulting form of the polished semiconductor wafer W outputted from the controller unit 32.

As for the form of the entire surface of the wafer, the polishing condition setting unit 51 analyzes the polishing conditions in accordance with the following criteria to set the polishing conditions for the next polishing step.

Based on the acquired resulting form of the polished semiconductor wafer W, an index value is obtained by subtracting the thickness at the point 1-mm or 2-mm inside from the outer peripheral edge of the wafer from the thickness at the center of the wafer. Based on the obtained index value, the polishing conditions for the next polishing step are automatically set in accordance with the following criteria (A1) to (A3). It should be noted that the following adjustment parameter $n_1$, which is obtained from a polishing speed, is used to adjust a polishing time in the polishing conditions.

(A1): When the index value falls within a range from −100 nm to +100 nm, the polishing conditions for the last polishing step are maintained.

(A2): When the index value exceeds 100 nm, the adjustment parameter $n_1$ is added to the polishing conditions for the last polishing step.

(A3): When the index value falls below −100 nm, the adjustment parameter $n_1$ is subtracted from the polishing conditions for the last polishing step.

As for the form of the outer periphery of the wafer, the polishing conditions for the next polishing step are set based on the following criteria.

Based on a difference (t1−t2) between a thickness t1 at the point 1-mm or 2-mm inside from the outer peripheral edge of the wafer and a thickness t2 at a position corresponding to t1 according to the approximate line of all the thicknesses measured within a range up to the point 30-mm inside (hereinafter, referred to as "a deviation from the approximate line"), the polishing conditions for the next polishing step are automatically set in accordance with the following criteria (B1) to (B3). It should be noted that the following adjustment parameter $m_1$, which is obtained from the polishing speed, is used to adjust the polishing time in the polishing conditions.

(B1): When the deviation from the approximate line falls within a range from −5 nm to +5 nm, the polishing conditions for the last polishing step are maintained.

(B2): When the deviation from the approximate line exceeds 5 nm, the adjustment parameter $m_1$ is added to the polishing conditions for the last polishing step.

(B3): When the deviation from the approximate line falls below −5 nm, the adjustment parameter $m_1$ is subtracted from the polishing conditions for the last polishing step.

Alternatively, the polishing conditions may be automatically controlled as follows.

At least one of the unpolished semiconductor wafers W is transported to the measuring device 3 by the transport device 4 to preliminarily measure the thickness thereof. In such a preliminary measurement, it is not necessary to measure the entire surface of the semiconductor wafer W but to measure only desired points on the semiconductor wafer W by the sensors 31 in the same manner as in the measuring step subsequent to the polishing step.

After the preliminary measurement, the unpolished semiconductor wafers W are transported to the double-side polishing machine 10 to be sequentially subjected to the polishing step, the immersing step, the pulling-up step and the measuring step.

An estimated polishing speed in the polishing step is then calculated by the following equation (1).

Equation 1

$$\text{Estimated Polishing Speed} = \frac{\left(\begin{array}{c}\text{Thickness of Unpolished} \\ \text{Semiconductor Wafer } W\end{array} - \begin{array}{c}\text{Thickness of Polished} \\ \text{Semiconductor Wafer } W\end{array}\right)}{\text{Polishing Time}} \quad (1)$$

Subsequently, prior to the next polishing step, at least one of the unpolished semiconductor wafers W is transported to the measuring device 3 to preliminarily measure the thickness thereof. A polishing time (end point) for the next polishing step is then calculated by the following equation (2). It should be noted that "Estimated Polishing Speed" in the equation (2) means the estimated polishing speed in the last polishing step calculated by the equation (1).

Equation 2

$$\text{Polishing Time} = \frac{\left(\begin{array}{c}\text{Thickness of Unpolished} \\ \text{Semiconductor Wafer } W \\ \text{before Next} \\ \text{Polishing Step}\end{array} - \begin{array}{c}\text{Target Thickness of} \\ \text{Polished Semiconductor} \\ \text{Wafer } W \text{ after Next} \\ \text{Polishing Step}\end{array}\right)}{\text{Estimated Polishing Speed}} \quad (2)$$

Based on the polishing time calculated by the equation (2), the polishing conditions for the next polishing step are set. The set polishing conditions are sent from the polishing condition setting unit 51 to the polishing controlling unit 52.

The measurement result of the form of the polished semiconductor wafer W is thus fed back to the polishing conditions for the next polishing step.

Advantage(s) of First Exemplary Embodiment

As described above, the first exemplary embodiment can provide the following advantages (1) to (7).

(1) The form of the polished semiconductor wafer W is measured before the polished surfaces thereof become hydrophilic, i.e., when the polished surfaces are hydrophobic.

The form of the polished semiconductor wafer W can thus be highly accurately measured without any measurement error caused by waterdrops.

(2) Prior to the measuring step, the polished semiconductor wafers W are immersed in the organic acid solution.

The immersion of the semiconductor wafers W in the organic acid solution allows the surfaces of the polished semiconductor wafers W to be kept hydrophobic, and thus reduces a dry time necessary for the surfaces of the semiconductor wafers W to be dried after immersed in the organic acid solution. Further, for instance, the polishing slurry remaining on the surfaces of the semiconductor wafers W having been rinsed with pure water after the polishing step can be neutralized.

(3) In the pulling-up step, the semiconductor wafer W is pulled up from the organic acid solution before the immersion time in the immersing step exceeds 60 minutes.

The polished surfaces of the semiconductor wafer W pulled up from the organic acid solution before the immersion time exceeds 60 minutes are kept hydrophobic. Thus, no waterdrop remains on the polished surfaces when the semiconductor wafer W is pulled up from the organic acid solution.

(4) In the pulling-up step, the semiconductor wafer W is pulled up at a speed of 100 mm/sec or less.

The semiconductor wafer W can be pulled up at the above speed without any rise of the solution from the level of the solution. No waterdrop thus remains on the polished surfaces of the semiconductor wafer W having been pulled up. The first exemplary embodiment can thus eliminate the necessity of adding a drying step after the pulling-up step, reducing the number of processing steps and shortening time required before the start of the measurement.

(5) In the pulling-up step, the semiconductor wafer W is pulled up while kept in the posture with the polished surfaces thereof being substantially orthogonal to the level of the solution.

As the semiconductor wafer W is pulled up while kept in the posture with the polished surfaces thereof being substantially orthogonal to the level of the solution, waterdrops are likely to gravitationally fall off. The waterdrops can thus be quickly removed from the polished surfaces. Consequently, the process quickly advances to the measuring step.

(6) In the measuring step, the form of the semiconductor wafer is measured using the optical sensor.

The use of the optical sensor leads to reducing measurement time and downsizing the measuring device. Feedback can thus be further quickly provided to the polishing conditions for the next polishing step.

(7) In the polishing condition setting step, polishing conditions for the next polishing step are set based on the measurement result in the measuring step.

The measurement result of the polished semiconductor wafer W can thus be quickly fed back to the polishing conditions for the next polishing step, thereby manufacturing highly accurate and flat semiconductor wafers W.

Second Exemplary Embodiment

Next, a second exemplary embodiment will be described. It should be noted that a semiconductor polishing apparatus of the second exemplary embodiment, which is structurally the same as that of the first exemplary embodiment, is not described here. A semiconductor wafer polishing method of the second exemplary embodiment will be described below.

Pre-Measuring Step

At least one of the unpolished semiconductor wafer W stored in the storing unit 6 is transported to the measuring device 3 by the transport device 4 to preliminarily measure the thickness thereof. In such a preliminary measurement, it is not necessary to measure the entire surface of the semiconductor wafer W but to measure only desired points on the semiconductor wafer W by the sensors 31 in the same manner as in the measuring step subsequent to the polishing step.

After the preliminary measurement, the unpolished semiconductor wafers W are transported to the double-side polishing machine 10 to be sequentially subjected to the polishing step, the immersing step and the pulling-up step in the same manner as in the first exemplary embodiment.

Measuring Step

In the measuring step, the form of at least one of the polished semiconductor wafers W is measured before the polished surfaces of the semiconductor wafer W become hydrophilic, i.e., when the polished surfaces are hydrophobic.

The semiconductor wafer W pulled up from the organic acid solution in the storage bath 2 in the pulling-up step before the immersion time in the immersing step exceeds 60 minutes is transported to the measuring device 3 by the transport device 4. Similarly to the first exemplary embodiment, the second exemplary embodiment requires the sensors 31 to measure not the entire surface of the semiconductor wafer W but only desired points on the semiconductor wafer W.

The measurement data acquired by the sensors 31 is processed by the controller unit 32 to calculate a difference (a numerical value) between: a difference in thickness at the center of the wafer between before and after polishing; and a difference in thickness at a point 1-mm or 2-mm inside from an outer peripheral edge of the wafer between before and after polishing. A polishing allowance form of the entire surface of the wafer is determined based on this calculation result.

The measurement data acquired by the sensors 31 is also processed by the controller unit 32 to calculate a deviation of a difference in thickness at the point 1-mm or 2-mm inside from the outer peripheral edge of the wafer between before and after polishing from an approximate line of differences in thickness at points within a range up to the point 30-mm inside between before and after polishing. A polishing allowance form of the outer periphery of the wafer is determined based on this calculation result.

The calculation results from the controller unit 32 are outputted to the controller 5.

After subjected to the form measurement performed by the measuring device 3, the semiconductor wafer W is returned to the storage bath 2 by the transport device 4.

Polishing Condition Setting Step

The controller 5 acquires the polishing conditions outputted from the double-side polishing machine 10 and the resulting form of the polished semiconductor wafer W outputted from the controller unit 32.

As for the polishing allowance form of the entire surface of the wafer, the polishing condition setting unit 51 analyzes the polishing conditions in accordance with the following criteria to set the polishing conditions for the next polishing step.

Based on the acquired resulting form of the polished semiconductor wafer W, an index value is obtained by subtracting the difference in thickness at the point 1-mm or 2-mm inside from the outer peripheral edge of the wafer between before and after polishing from the difference in thickness at the center of the wafer between before and after polishing. Based on the obtained index value, the polishing conditions for the next polishing step are automatically set in accordance with the following criteria (C1) to (C3). It should be noted that the following adjustment parameter $n_2$, which is obtained from a polishing speed, is used to adjust a polishing time in the polishing conditions.

(C1): When the index value falls within a range from −50 nm to +50 nm, the polishing conditions for the last polishing step are maintained.
(C2): When the index value exceeds +50 nm, the adjustment parameter $n_2$ is added to the polishing conditions for the last polishing step.
(C3): When the index value falls below −50 nm, the adjustment parameter $n_2$ is subtracted from the polishing conditions for the last polishing step.

As for the polishing allowance form of the outer periphery of the wafer, the polishing conditions for the next polishing step are set based on the following criteria.

Based on the deviation of the difference in thickness at the point 1-mm or 2-mm inside from the outer peripheral edge of the wafer between before and after polishing from the approximate line of differences in thickness at all the point within the range up to the point 30-mm inside between before and after polishing, the polishing conditions for the next polishing cycle are automatically set in accordance with the following criteria (D1) to (D3). It should be noted that the following adjustment parameter $m_2$, which is obtained from a polishing speed, is used to adjust a polishing time in the polishing conditions.

(D1): When the deviation from the approximate line falls within a range from −5 nm to +5 nm, the polishing conditions for the last polishing step are maintained.
(D2): When the deviation from the approximate line exceeds 5 nm, the adjustment parameter $m_2$ is added to the polishing conditions for the last polishing step.
(D3): When the deviation from the approximate line falls below −5 nm, the adjustment parameter $m_2$ is subtracted from the polishing conditions for the last polishing step.

Alternatively, the polishing conditions may be automatically controlled as follows.

At least one of the unpolished semiconductor wafers W is transported to the measuring device 3 by the transport device 4 to preliminarily measure the thickness thereof. In such a preliminary measurement, it is not necessary to measure the entire surface of the semiconductor wafer W but to measure only desired points on the semiconductor wafer W by the sensors 31 in the same manner as in the measuring step subsequent to the polishing step.

After the preliminary measurement, the unpolished semiconductor wafers W are transported to the double-side polishing machine 10 to be sequentially subjected to the polishing step, the immersing step, the pulling-up step and the measuring step.

Subsequently, an estimated polishing speed in the polishing step is calculated by the following equation (3).

Equation 3

$$\text{Estimated Polishing Speed} = \frac{\left(\begin{array}{c}\text{Thickness of Unpolished} \\ \text{Semiconductor Wafer } W\end{array} - \begin{array}{c}\text{Thickness of Polished} \\ \text{Semiconductor Wafer } W\end{array}\right)}{\text{Polishing Time}} \quad (3)$$

Subsequently, prior to the next polishing step, at least one of the unpolished semiconductor wafers W is transported to the measuring device 3 to preliminarily measure the thickness thereof. A polishing time (end point) for the next polishing step is then calculated by the following equation (4). It should be noted that "Estimated Polishing Speed" in the equation (4) means the estimated polishing speed in the polishing step calculated by the equation (3).

Equation 4

$$\text{Polishing Time} = \frac{\text{Target Polishing Allowance to be Taken from Semiconductor Wafer } W \text{ Polished in Next Polishing Step}}{\text{Estimated Polishing Step}} \quad (4)$$

Based on the polishing time calculated by the equation (4), the polishing conditions for the next polishing step are set. The set polishing conditions are sent from the polishing condition setting unit 51 to the polishing controlling unit 52.

The measurement result of the form of the polished semiconductor wafer W is thus fed back to the polishing conditions for the next polishing step.

MODIFICATION(S)

In the first and second exemplary embodiments, the single measuring device 3 is used for the single double-side polishing machine 10. Alternatively, the single measuring device 3 may be disposed between two double-side polishing machines 10. The single measuring device 3 can thus measure the forms of the semiconductor wafers W independently polished by the two double-side polishing machines 10. Consequently, a set of semiconductor wafer polishing apparatus can be installed with halved installation costs for the measuring device 3.

In the second exemplary embodiment, the polishing device 1 is exemplified by the double-side polishing machine 10, but may be a single-side polishing machine usable for intermediate-finish polishing. The double-side polishing machine 10 is capable of removing a large dimension of an allowance in a range from 5 μm to 30 μm, and thus is suitable for rough polishing. In contrast, the single-side polishing machine is capable of removing a small dimension of an allowance in a range from 0.2 μm to 1.0 μm, and thus is suitable for favorably finalizing surfaces of semiconductor wafers. The double-side polishing machine is suitable for the first exemplary embodiment. The single-side polishing machine is suitable for the second exemplary embodiment where the semiconductor wafer is profiled before and after polishing to provide feedback.

In the first and second exemplary embodiments, the two sensors 31 are used to measure the front and back surfaces of the semiconductor wafer W. Alternatively, a single sensor 31 may be used to measure only one surface of the semiconductor wafer W. Such an arrangement where the single sensor 31 is provided is suitable for when the semiconductor wafer W to be measured has a small thickness such as 310 μm or less.

In the first and second exemplary embodiments, the storage bath 2 contains the organic acid solution, but may contain a hydrofluoric acid solution instead of the organic acid solution. The hydrofluoric acid solution makes the polished surfaces of the semiconductor wafers W hydrophobic.

EXAMPLE(S)

Example 1

The semiconductor wafer W with a diameter of 300 mm was double-side polished by the semiconductor wafer polishing apparatus shown in FIG. 1. It should be noted that the solution contained in the storage bath 2 was a citric acid solution with a concentration of 0.1 mass % kept at 25 degrees C.

First, the unpolished semiconductor wafer W was transported from the storing unit 6 to the double-side polishing machine 10 by the transport unit 40 along with the carrier 15. The semiconductor wafer W was then double-side polished under predetermined conditions while being supplied with a polishing slurry. The double-side polished semiconductor wafer W was then rinsed with supplied pure water.

After being rinsed, the polished semiconductor wafer W was transported from the double-side polishing machine 10 to the storage bath 2 by the transport unit 40. The transported semiconductor wafer W was immersed and kept in the citric acid solution in the storage bath 2 for one minute.

After being kept in the citric acid solution for the predetermined time, the semiconductor wafer W was pulled up at a speed of 100 mm/sec by the transport unit 40 while kept in the posture with the polished surfaces of the semiconductor wafer W being substantially orthogonal to the level of the solution.

The surfaces (the polished surfaces) of the semiconductor wafer W pulled up from the solution were hydrophobic, and thus no remaining waterdrop was seen on the surfaces.

Subsequently, the semiconductor wafer W was transported to the spectral interference displacement device 30 by the transport unit 40. In the spectral interference displacement device 30, the semiconductor wafer W was moved at a speed of 3 mm/sec by the transport unit 40 so that the sensors 31 radially measured the semiconductor wafer W from the center toward the outer periphery of the semiconductor wafer W at a pitch of 10 μm up to a point 2-mm inside from the outer peripheral edge of the semiconductor wafer W. The measurement data was then processed by the controller unit 32 to calculate the form of the entire surface of the wafer.

The calculation result was outputted to the polishing condition setting unit 51. Based on the acquired resulting form of the polished semiconductor wafer W, the polishing condition setting unit 51 obtained an index value by subtracting the thickness at the point 2-mm inside from the outer peripheral edge of the wafer from the thickness at the center of the wafer. Based on the index value, polishing conditions for the next polishing step were adjusted in accordance with the criteria (A1), (A2) and (A3). Measurement results of the form of the semiconductor wafer W polished under the adjusted polishing conditions proved an improvement in a process capability in terms of GBIR quality.

It should be noted that GBIR, which is an abbreviation of "Global flatness Back reference Ideal Range", is a standard parameter for flatness.

Comparative Example 1

The semiconductor wafer W with a diameter of 300 mm was double-side polished by the semiconductor wafer polishing apparatus shown in FIG. 1 in the same manner as in Example 1. It should be noted that the storage bath 2 contained pure water kept at 25 degrees.

The double-side polished semiconductor wafer W was transported from the double-side polishing machine 10 to the storage bath 2 by the transport unit 40. The transported semiconductor wafer W was immersed and kept in the pure water in the storage bath 2 for 60 minutes.

After being kept in the pure water for the predetermined time, the semiconductor wafer W was pulled up at a speed of 100 mm/sec by the transport unit 40 while kept in the posture with the polished surfaces of the semiconductor wafer W being substantially orthogonal to the level of the pure water.

The surfaces (the polished surfaces) of the semiconductor wafer W pulled up from the pure water were hydrophilic, and thus remaining waterdrops were seen on the surfaces. Therefore, the form of the entire surface of the wafer failed to be measured by the spectral interference displacement device 30.

Example 2

The measurement data obtained by measurement using the sensors 31 in Example 1 was processed by the controller unit 32 to calculate the form of the outer periphery of the wafer.

The calculation result was outputted to the polishing condition setting unit 51. Based on the acquired resulting form of the polished semiconductor wafer W, the polishing condition setting unit 51 calculated a deviation from an approximate line. Based on the deviation from the approximate line, polishing conditions for the next and future polishing steps were adjusted in accordance with the criteria (B1), (B2) and (B3). Measurement results of the form of the semiconductor wafer W polished under the adjusted polishing conditions proved an improvement in a process capability in terms of ESFQR quality.

Incidentally, ESFQR, which is an abbreviation of "Edge flatness metric, Sector based, Front surface referenced, least sQuares fit reference plane, Range of the data within sector", is a measurement value of SFQR in each sectorial area (sector) defined in the outer periphery along the entire circumference of the wafer. SFQR is obtained by dividing the semiconductor wafer W into a number of parts (sites), measuring a positive-side maximum variation and a negative-side maximum variation relative to a reference plane defined in each site, and summing up an absolute value of the positive-side maximum variation and an absolute value of the negative-side maximum variation.

Comparative Example 2

In Comparative Example 1, in which the form of the entire surface of the wafer failed to be measured, the form of the outer periphery of the wafer also failed to be calculated.

Example 3

The semiconductor wafer W with a diameter of 300 mm was finish-polished by a semiconductor wafer polishing apparatus including a single-side polishing machine (a finish-polishing machine) in place of the double-side polishing machine 10 shown in FIG. 1. It should be noted that the solution contained in the storage bath 2 was a citric acid solution with a concentration of 0.1 mass % kept at 25 degrees C.

Subsequently, the semiconductor wafer W was first transported to the spectral interference displacement device 30 by the transport unit 40. In the spectral interference displacement device 30, the semiconductor wafer W was moved at a speed of 3 mm/sec by the transport unit 40 so that the sensors 31 radially measured the semiconductor wafer W from the center toward the outer periphery of the semiconductor wafer W at a pitch of 10 µm. The measurement data was then processed by the controller unit 32 to calculate the polishing allowance form of the entire surface of the wafer.

Next, the unpolished semiconductor wafer W was transported from the storing unit 6 to the finish-polishing machine 10 by the transport unit 40 along with the carrier 15. The semiconductor wafer W was then finish-polished under predetermined conditions while being supplied with a polishing slurry. The finish-polished semiconductor wafer W was then rinsed with supplied pure water.

The finish-polished semiconductor wafer W was transported from the finish-polishing machine to the storage bath 2 by the transport unit 40. The transported semiconductor wafer W was immersed and kept in the citric acid solution in the storage bath 2 for one minute.

After being kept in the citric acid solution for the predetermined time, the semiconductor wafer W was pulled up at a speed of 100 mm/sec by the transport unit 40 while kept in the posture with the polished surfaces of the semiconductor wafer W being substantially orthogonal to the level of the solution.

The surfaces (the polished surfaces) of the semiconductor wafer W pulled up from the solution were hydrophobic, and thus no remaining waterdrop was seen on the surfaces.

Subsequently, the semiconductor wafer W was transported to the spectral interference displacement device 30 by the transport unit 40. In the spectral interference displacement device 30, the semiconductor wafer W was moved at a speed of 3 mm/sec by the transport unit 40 so that the sensors 31 radially measured the semiconductor wafer W from the center toward the outer periphery of the semiconductor wafer W at a pitch of 10 µm. The measurement data was then processed by the controller unit 32 to calculate the polishing allowance form of the entire surface of the wafer.

The calculation result was outputted to the polishing condition setting unit 51. Based on the acquired resulting form of the polished semiconductor wafer W, the polishing condition setting unit 51 obtained an index value by subtracting a difference in thickness at the point 2-mm inside from the outer peripheral edge of the wafer between before and after polishing from a difference in thickness at the center of the wafer between before and after polishing. Based on the index value, polishing conditions for the next polishing step were adjusted in accordance with the criteria (C1), (C2) and (C3). Measurement results of the polishing allowance form of the semiconductor wafer W polished under the adjusted polishing conditions proved an improvement in a process capability in terms of GBIR quality.

Comparative Example 3

The semiconductor wafer W with a diameter of 300 mm was finish-polished by a semiconductor wafer polishing apparatus including a single-side polishing machine (a finish-polishing machine) in place of the double-side polishing machine 10 shown in FIG. 1 in the same manner as in Example 3. It should be noted that the storage bath 2 contained pure water kept at 25 degrees.

The finish-polished semiconductor wafer W was transported from the finish-polishing machine to the storage bath 2 by the transport unit 40. The transported semiconductor wafer W was immersed and kept in the pure water in the storage bath 2 for 60 minutes.

After being kept in the pure water for the predetermined time, the semiconductor wafer W was pulled up at a speed of 100 mm/sec by the transport unit 40 while kept in the posture with the polished surfaces of the semiconductor wafer W being substantially orthogonal to the level of the pure water.

The surfaces (the polished surfaces) of the semiconductor wafer W pulled up from the pure water were hydrophilic, and thus remaining waterdrops were seen on the surfaces. Therefore, the polishing allowance form of the wafer failed to be measured by the spectral interference displacement device 30.

Example 4

The measurement data obtained by measurement using the sensors 31 in Example 3 was processed by the controller unit 32 to calculate the polishing allowance form of the outer periphery of the wafer.

The calculation result was outputted to the polishing condition setting unit 51. Based on the acquired forms of the semiconductor wafer W before and after polishing, the polishing condition setting unit 51 calculated a deviation of a difference in thickness between before and after polishing from an approximate line. Based on the deviation from the approximate line, polishing conditions for the next polishing step were adjusted in accordance with the criteria (D1), (D2) and (D3). Measurement results of the polishing allowance form of the semiconductor wafer W polished under the adjusted polishing conditions proved an improvement in a process capability in terms of ESFQR quality.

Comparative Example 4

In Comparative Example 3, in which the polishing allowance form of the wafer failed to be measured, the polishing allowance form of the outer periphery of the wafer also failed to be calculated.

The invention claimed is:
1. A semiconductor wafer polishing method consisting of:
providing an organic acid solution;
polishing a semiconductor wafer;
immersing the semiconductor wafer in the organic acid solution after the semiconductor wafer is polished but before the semiconductor wafer is measured;
pulling up the semiconductor wafer from the organic acid solution before an immersion time of the immersing exceeds 60 minutes;
measuring a form of the semiconductor wafer by an optical sensor before a polished surface of the semiconductor wafer becomes hydrophilic; and
setting polishing conditions for the polishing based on a measurement result of the form of the semiconductor wafer, wherein
an organic acid in the organic acid solution comprises at least one of a citric acid, a formic acid, an acetic acid, a butyric acid, an oxalic acid, a malonic acid and a succinic acid.

2. The semiconductor wafer polishing method according to claim 1, wherein the semiconductor wafer is pulled up at a speed of 100 mm/sec or less.

3. The semiconductor wafer polishing method according to claim 1, wherein the semiconductor wafer is pulled up while kept in a posture with the polished surface of the semiconductor wafer being substantially orthogonal to a horizontal surface of the organic acid solution.

4. The semiconductor wafer polishing method according to claim 1, wherein the concentration of the organic acid solution is provided to be within a range of 0.001 mass percent to 0.1 mass percent.

* * * * *